United States Patent
Shin et al.

(10) Patent No.: US 8,779,793 B2
(45) Date of Patent: Jul. 15, 2014

(54) SYSTEM AND METHOD FOR TEMPERATURE CYCLING

(75) Inventors: Kyung Mo Shin, Saratoga, CA (US); Thomas McMullen, San Jose, CA (US); Dong Wook Kim, San Jose, CA (US)

(73) Assignee: Nvidia Corporation, Santa Clara, CA (US)

(*) Notice: Subject to any disclaimer, the term of this patent is extended or adjusted under 35 U.S.C. 154(b) by 485 days.

(21) Appl. No.: 12/716,863

(22) Filed: Mar. 3, 2010

(65) Prior Publication Data

US 2011/0215825 A1  Sep. 8, 2011

(51) Int. Cl.
  *G01R 31/26* (2014.01)
  *G01R 31/28* (2006.01)
  *H01L 21/67* (2006.01)

(52) U.S. Cl.
  CPC ............ *G01R 31/26* (2013.01); *G01R 31/2851* (2013.01); *H01L 21/67115* (2013.01)
  USPC .................................................. 324/762.01

(58) Field of Classification Search
  USPC ........................................ 324/750.06, 762.01
  See application file for complete search history.

(56) References Cited

U.S. PATENT DOCUMENTS

| | | | | |
|---|---|---|---|---|
| 3,710,251 A * | 1/1973 | Hagge et al. | ............. | 324/750.08 |
| 5,977,785 A * | 11/1999 | Burward-Hoy | .......... | 324/750.09 |
| 6,466,038 B1 * | 10/2002 | Pekin et al. | ................... | 324/719 |
| 6,593,761 B1 * | 7/2003 | Fukasawa et al. | ....... | 324/750.13 |
| 6,867,611 B2 * | 3/2005 | Stone | ........................ | 324/750.08 |
| 6,891,385 B2 * | 5/2005 | Miller | ....................... | 324/750.08 |
| 6,919,224 B2 * | 7/2005 | Sane et al. | .................... | 438/106 |
| 7,170,276 B2 * | 1/2007 | Park et al. | ................ | 324/750.08 |
| 7,202,684 B2 * | 4/2007 | Fenk | ........................ | 324/750.07 |
| 7,479,795 B2 * | 1/2009 | Hayashi et al. | ........... | 324/750.09 |
| 7,626,407 B2 * | 12/2009 | Kabbani | ................... | 324/750.03 |
| 8,278,956 B2 * | 10/2012 | Losey et al. | .............. | 324/756.03 |
| 2003/0113106 A1 * | 6/2003 | Hwang et al. | ................. | 392/416 |
| 2006/0003496 A1 * | 1/2006 | Sane et al. | .................... | 438/127 |
| 2006/0152239 A1 * | 7/2006 | Nam et al. | ................... | 324/760 |
| 2007/0159202 A1 * | 7/2007 | Noel et al. | .................... | 324/765 |
| 2008/0042668 A1 * | 2/2008 | Eldridge et al. | .............. | 324/754 |
| 2010/0125377 A1 * | 5/2010 | Kim et al. | ..................... | 324/765 |

* cited by examiner

Primary Examiner — Jermele M Hollington

(57) ABSTRACT

A system and method for non-isothermal temperature cycling (also called Conduction Temperature Cycling) of a semiconductor device. The method includes inserting a semiconductor device into a testing chamber and thermally coupling the semiconductor device to a heating and cooling element via a vacuum holding component. The method further includes heating and cooling a die portion of the semiconductor device with the heating and cooling element and testing the semiconductor device for component failure caused by thermo-mechanical stress induced by the non-isothermal temperature cycling. In one embodiment, the heating and cooling comprises non-isothermal temperature cycling.

21 Claims, 8 Drawing Sheets

400

Power On
200

- Die Temperature Up
  202
- Bump/Underfill Temperature Up
  204
- Substrate Temperature Up
  206
- BGA/Balls Temperature Up
  208
- PCB Temperature Up
  210

FIG. 2A

Power Off
250

- Die Temperature Down
  252
- Bump/Underfill Temperature Down
  254
- Substrate Temperature Down
  256
- BGA/Balls Temperature Down
  258
- PCB Temperature Down
  260

FIG. 2B

SYSTEM AND METHOD FOR TEMPERATURE CYCLING

FIELD OF THE INVENTION

Embodiments of the present invention are generally related to temperature cycling systems and device testing.

BACKGROUND OF THE INVENTION

As computer systems have advanced, processing power and capabilities have increased both terms of general processing and more specialized processing such as graphics processing and chipsets. As a result, increasingly smaller and more powerful chips are constantly manufactured. As smaller more advanced chips are made, the number of transistors increases resulting in increased power consumption and heat production. This has made chip cooling important but has also made the packaging materials important as repeated heating and cooling during typical usage induces stresses on packages thereby effecting the life of the chip.

Before a chip package is finalized, the design is tested to ensure it is able to withstand stresses induced by repeated heating and cooling during usage. During semiconductor qualification, temperature cycling is done to simulate the temperature going up and down and thereby inducing thermo-mechanical failure. As the temperature goes up and down, there is a thermal mismatch between different materials in a package. For example, the thermal expansion coefficient of a silicon die and the thermal expansion coefficient of its substrate may be different. Thus, at higher temperatures the substrate may expand more than the die unfortunately causing stress at the interface between the die and the substrate.

Currently, accelerated temperature cycling (ATC) is used widely as a semiconductor test method to address thermo mechanical failure mechanisms likely to occur in actual field operations. ATC creates thermo-mechanical stress by alternating the chamber ambient temperature to reach designated high and low temperature extremes. Due to this ambient driven temperature control, the whole body of the testing package or system follows the ambient temperature. That is, the heating and cooling are done by heating and cooling the test chamber surrounding the package. One of the problems with this kind of traditional temperature cycling is that it is isothermal because the temperature is driven by the ambient temperature and the chip remains unpowered. Thus, each component within the package changes temperature at the same time.

Unfortunately, thermo-mechanical stresses from actual operating conditions are quite different from the ambient controlled isothermal nature of ATC. Under typical user conditions of power on/standby/off cycling of devices, the powered silicon (Si) die thereof acts as a heat source while other components act as heat dissipaters. This creates non-uniform heating and non-uniform temperature distribution in the package. This may make the device or system deform different than would be observed with ATC. Thus, when ATC testing is used the results do not sufficiently reflect real world conditions. That is, ATC is not able to simulate an actual user's power on/standby/off cycling conditions due to the nature of ATC being an isothermal ambient temperature controlled test method.

Two conventional solutions have attempted to mimic the non-isothermal temperature gradient of actual user conditions. One conventional method uses a thermal test chip which creates self heating when powered on. However, this method does not provide consistent and accurate temperature profiles across testing devices as thermal behavior of each device can be different. It may require a dedicated active heat sink for fast cooling to increase the number of cycles within a given time period. The testing temperature range is also limited as this method relies on self heating and ambient temperature cooling.

Another conventional method uses a real application system with a mounted testing device. For example, a testing device is soldered down to a real computer system. By turning the computer on and off (or power cycling), the testing device is self heated and ambiently cooled. However, this method also does not provide consistent and accurate temperature profiles across testing devices as thermal behavior of each device can be different. The testing temperature range and number of cycles within a given time period are also limited as this method relies on self heating and ambient temperature cooling. Further, this method involves high costs and time in building systems, developing special software, and maintenance.

SUMMARY OF THE INVENTION

Accordingly, what is needed is a temperature cycling system that reflects real world conditions and accommodates different semiconductor packages. Embodiments of the present invention thus provide for non-isothermal temperature cycling testing reflective of real usage conditions. This allows individually controlled testing of various semiconductor device material compositions under real world conditions. Embodiments of the present invention further provide a universal thermal coupling allowing different semiconductor designs and packages to be tested without need for specialized hardware. Thus, economical testing solutions both in terms of time and cost are provided.

In one embodiment, the present invention is implemented as a method for non-isothermal temperature cycling of a packaged semiconductor device. The method includes loading a semiconductor device into a testing chamber and thermally coupling the semiconductor device to a heating and cooling element via a vacuum holding component. The method further includes heating and cooling a die portion of the semiconductor device with the heating and cooling element and testing the semiconductor device for component failure caused by thermo-mechanical stress induced by the non-isothermal temperature cycling. In one embodiment, the heating and cooling comprises non-isothermal temperature cycling.

In another embodiment, the present invention is implemented as a system for non-isothermal temperature cycling of a semiconductor device. The system includes means for thermally coupling a plurality of semiconductor devices and means for transferring thermal energy to and from the plurality of semiconductor devices. The means for thermal coupling may be operable to thermally couple a plurality of different semiconductor device designs. In one embodiment, transferring of thermal energy causes non-isothermal temperature cycling. The system further includes means for testing the plurality of semiconductor devices for thermo-mechanical failure.

In yet another embodiment, the present invention is implemented as a system for testing a plurality of packaged semiconductor devices. The system includes a plurality of heating and cooling elements operable to non-uniformly heat and cool the plurality of semiconductor devices and a plurality of thermal coupling elements operable to thermally couple the plurality of semiconductor devices to the plurality of heating and cooling elements. The system further includes a plurality of testing elements operable to detect thermo-mechanical failure of each of the plurality of semiconductor devices.

In this manner, embodiments provide accelerated and economical testing with non-isothermal temperature cycling. Embodiments further provide universal testing of different semiconductor packages and deigns under real world like conditions

BRIEF DESCRIPTION OF THE DRAWINGS

The present invention is illustrated by way of example, and not by way of limitation, in the figures of the accompanying drawings and in which like reference numerals refer to similar elements.

FIGS. 2A-B show exemplary heating and cooling of semiconductor components during typical computing system usage.

DETAILED DESCRIPTION OF THE INVENTION

Figure 1:
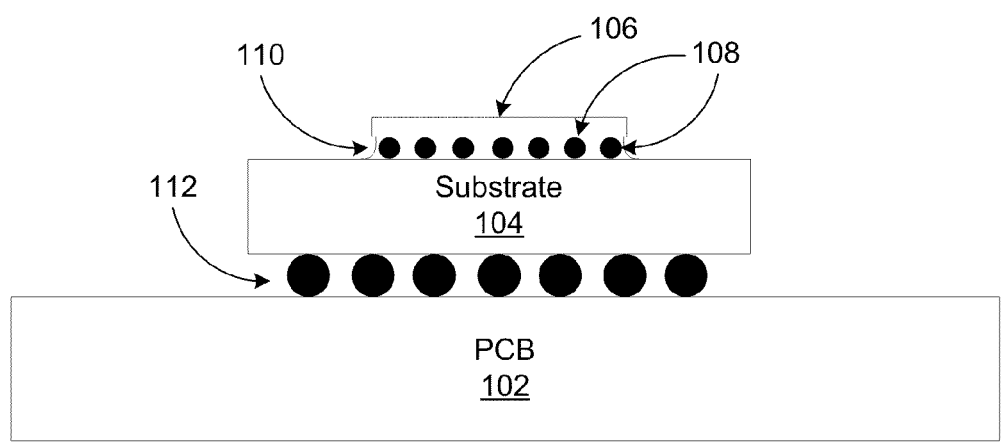
FIG. 1 shows an exemplary semiconductor package as can be tested, in accordance an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.
Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of an integrated circuit (e.g., computing system 800 of FIG. 8), or similar electronic computing device, that manipulates and transforms data represented as physical (electronic) quantities within the computer system's registers and memories into other data similarly represented as physical quantities within the computer system memories or registers or other such information storage, transmission or display devices.

Non-Isothermal Temperature Cycling

FIG. 1 shows an exemplary semiconductor package as can be tested, in accordance an embodiment of the present invention. Exemplary semiconductor package or integrated circuit (IC) 100 includes die 106, underfill 110, bumps 108, substrate 104, and ball grid array (BGA) or balls 112. Semiconductor device 100 may be a variety of devices types including a graphics processing unit (GPU), chipset, or central processing unit (CPU), etc. Semiconductor device 100 may also have a metal heat spreader (not shown).

Semiconductor package 100 may mounted on printed circuit board (PCB) 102. It is noted that semiconductor package 100 may be tested without PCB 102 (e.g., motherboard or graphics card board). Semiconductor package 100 may be manufactured and the soldered down to PCB 102 (e.g., via a motherboard or graphics card manufacturer).

Die 106 includes circuitry for performing processing (e.g., graphics processing, central processing, or chipset processing and functionality). In one embodiment, die 106 includes silicon material which makes up a substantial portion of the circuit of die 106.

Bumps 108 couple die 106 to substrate 104. Bumps 108 acts as an interconnect between substrate 104 and die 106 to communicatively couple die 106 and substrate 104. Underfill 110 provides structural support for bumps 108 such that bumps 108 are not damaged when force is applied to die 106 or semiconductor package 100.

Substrate 104 may be coupled to PCB 102 via balls 112 which communicatively couple substrate 104 to PCB 102 and thereby communicatively couple die 106 to PCB 102 (e.g., via bumps 108). Bumps 108 and balls 112 may be made of solder. Bumps 110 are typically smaller and thus structurally weaker than balls 112.

FIGS. 2A-B show exemplary heating and cooling steps of semiconductor components during typical computing system usage. FIGS. 2A-B illustrate that the heating and cooling of the semiconductor components resulting from the heat production by the die portion which in turn heats other semiconductor components. That is, it is appreciated that computer system usage results in non-uniform heating and cooling of semiconductor components.

Referring to FIG. 2A, the heating process is shown of a semiconductor package as a computer system is powered on. It is noted that the die, the bump/underfill material, substrate, BGA/balls, and the PCB are at ambient temperature when the computer is first powered on. At block 202, the die temperature increases as a result of performing processing operations (e.g., graphics processing, chipset processing, or central processing unit processing). At block 204, the bump and underfill material temperature increases as a result of the die temperature increasing. At block 206, the substrate temperature increases as a result of the bump and underfill temperature increase. At block 208, the BGA or balls temperature increases as a result of the substrate temperature increasing. At block 210, the PCB temperature increases as a result of the BGA or balls temperature increasing.

Referring to FIG. 2B, a cooling process is shown of a semiconductor package as a computer system is powered off (or enters a low power mode, e.g., sleep).

At block 252, the die temperature decreases by processing operations ceasing (e.g., power off or entering a low power state). It is appreciated that only the die portion (e.g., transistors of the die portion) of the semiconductor package consumes power when the semiconductor device is powered on. That is, the die portion of the semiconductor package acts to self heat the semiconductor package. It is appreciated that this consumption of power causes the semiconductor package temperature rise and fall. It is further appreciated that the heat generated by the die portion creates a temperature gradient across the semiconductor package.

At block 254, the bump/underfill material temperature decreases as a result of the die ceasing to produce heat. At block 256, the substrate temperature decreases as a result of the temperature of the bump/underfill temperature deceasing and the die ceasing to produce heat. At block 258, the BGA or balls temperature decreases as a result of the substrate temperature decreasing and the die ceasing to produce heat. At block 260, the PCB temperature decreases as a result of the BGA or balls temperature decreasing and the die ceasing to produce heat.

It is noted that traditional temperature cycling is isothermal where the temperature of the whole body of a package goes up and down at the same time. In contrast, in the real world there is a temperature gradient across a package which may create a different failure mechanism. One such failure mechanism is due to different thermal properties exhibited by different materials of the semiconductor package and the temperature difference between the various portions of the semiconductor package. For example, the thermal effects of the temperature gradient can cause the semiconductor package to fail (e.g., fracture of a portion of the package).

Figure 3:
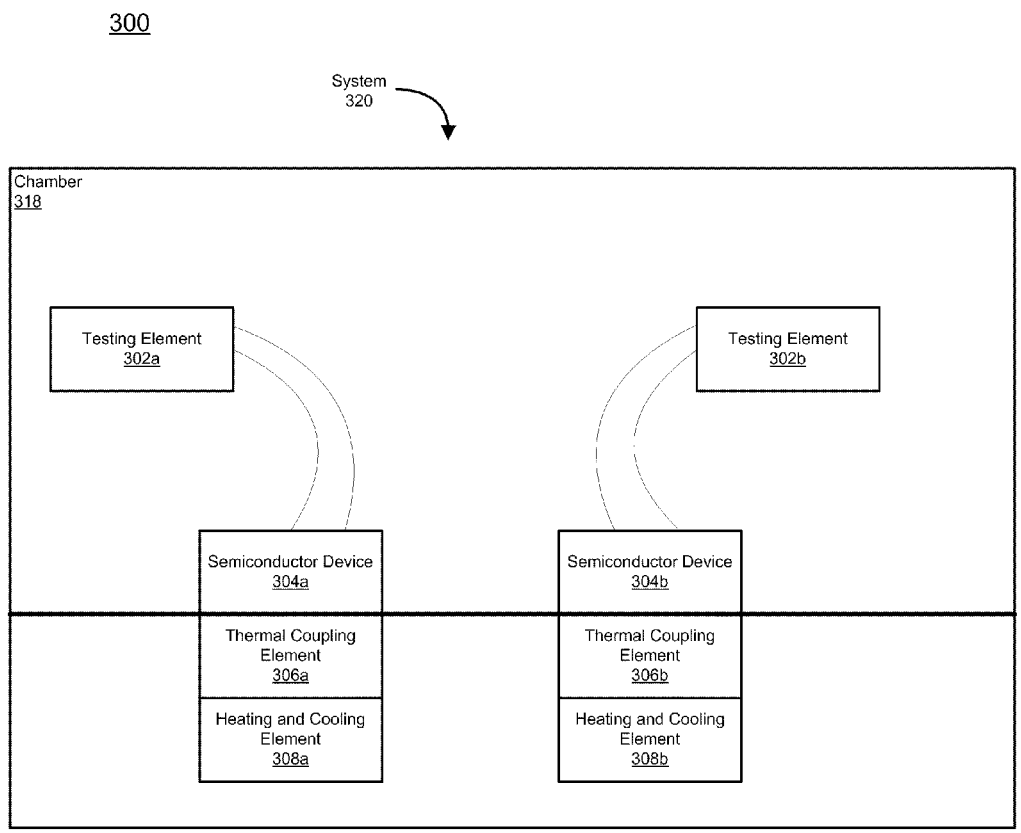
FIG. 3 shows a block diagram of an exemplary testing environment, in accordance with an embodiment of the present invention.

FIG. 3 illustrates example components used by various embodiments of the present invention. Although specific components are disclosed in system 300, it should be appreciated that such components are exemplary. That is, embodiments of the present invention are well suited to having various other components or variations of the components recited in system 300. It is appreciated that the components in system 300 may operate with other components than those presented, and that not all of the components of system 300 may be required to achieve the goals of system 300.

FIG. 3 shows a block diagram of an exemplary test environment, in accordance with an embodiment of the present invention. Exemplary test environment 300 includes testing system 320 operable for testing a plurality of semiconductor devices. System 320 includes test elements 302a-b, semiconductor devices 304a-b, thermal coupling element 306a-b, heating and cooling elements 308a, and chamber 318. Chamber 318 provides an ambient temperature control for testing of semiconductor devices 304a-b.

Semiconductor devices 304a-b may be of any type including a central processing unit (CPU), chipset, or graphics processing unit (GPU), etc. In one embodiment, semiconductor devices 304a-b are in a flipped over (e.g., upside down) configuration for testing in system 320. Semiconductor devices 304a-b may be selected based on having different material compositions for testing under temperature cycling.

In one embodiment, test elements 302a-b are operable to test operations of semiconductor devices 304a-b, respectively. Test elements 302a-b are operable to electrically couple to each of semiconductor devices 304a-b. In one embodiment, test element 302a-b are operable to test for thermo-mechanical failure (e.g., caused by temperature gradient induced stress) of semiconductor devices 304a-b. More specifically, testing elements 302a-b may be operable to detect failure in solder bumps (e.g., bumps 108) between a die and a substrate of each of the plurality of semiconductor devices. In one embodiment, the components of testing elements 302a-b test for thermo-mechanical failure by monitoring resistance of the semiconductor devices 304a-b in real-time. It is appreciated that testing elements 302a-b may optionally be located outside of chamber 318. Testing elements 302a-b thus facilitate testing each possible combination of materials of the plurality of semiconductor devices 304a-b and determine which material composition performs optimally (e.g., lasts the longest).

In one embodiment, semiconductor devices 304a-b are daisy chained thereby providing an electrical path for testing resistance. Daisy chained devices thus allow testing for thermo-mechanical failure as resistance will increase promptly upon the failure of the connection.

Thermal coupling elements 306a-b are operable to thermally couple semiconductor devices 304a-b to heating and cooling elements 308a-b, respectively. In one embodiment, thermal coupling elements 306a-b each include a vacuum plate. In one embodiment, thermal coupling elements 306a-b thermally couple a die portion of each of semiconductor devices 304a-b to heating and cooling elements 308a-b, respectively.

Importantly, heating and cooling elements 308a-b heat and cool semiconductor devices 304a-b to perform non-isothermal temperature cycling. That is, heating and cooling elements 308a-b are operable to transfer thermal energy to and from semiconductor devices 304a-b and thereby non-uniformly heat and cool semiconductor devices 304a-b. In one embodiment, heating and cooling elements 308a-b can be a variety of devices including a peltier which provides heating and cooling (e.g., below room temperature). Heating and cooling elements 308a-b may be operable to individually control thermal energy transfer to each of semiconductor devices 304a-b. It is appreciated that heating elements may be used in place of heating and cooling elements 308a-b.

Figure 4:
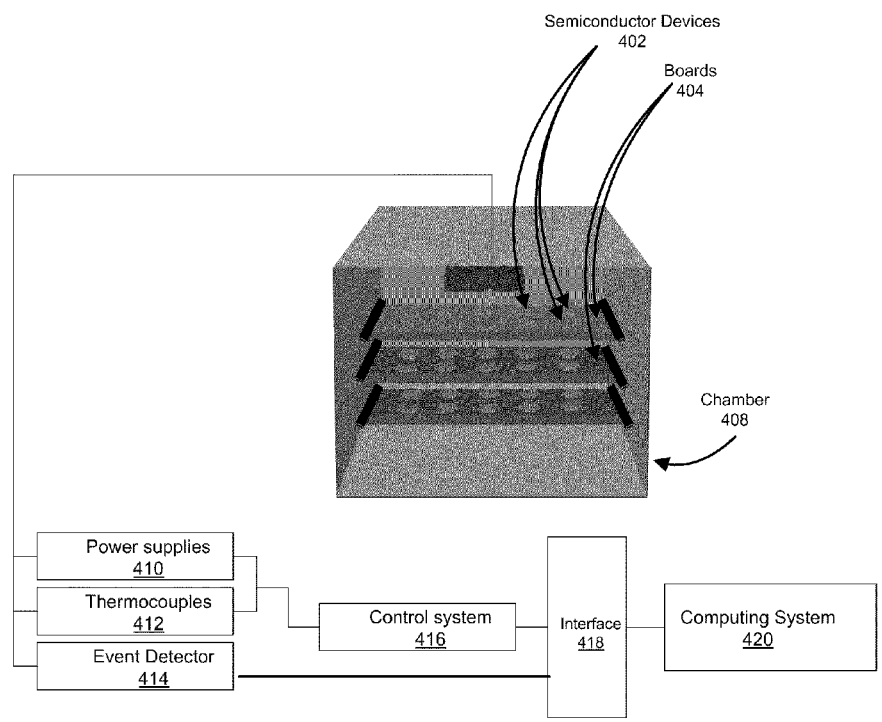
FIG. 4 shows a block diagram of an exemplary test system, in accordance with an embodiment of the present invention.

FIG. 4 shows a block diagram of an exemplary test system, in accordance with an embodiment of the present invention. Exemplary test system 400 includes semiconductor devices 402, heating and cooling elements boards 404, fan 406a-b, chamber 408, power supplies 410, thermocouples 412, event detector 414, control system 416, interface 418, and computing system 420.

Heating and cooling elements boards 404 support semiconductor devices 402 in chamber 408. In one embodiment, semiconductor devices 402 are upside down on boards 404.

Each of the heating and cooling elements provide individual control and desired temperature profiles.

Power supplies 410 provide power to heating and cooling elements (e.g., heating and cooling element 408a-b) for non-isothermal temperature cycling of semiconductor devices 402.

Thermocouples 412 thermally couple semiconductor devices 402, within chamber 408, to heating and cooling elements (e.g., heating and cooling elements 408a-b). Event detector 414 detects electrical events in chamber 408 and is coupled to interface 418. In one embodiment, event detector 414 is operable to detect thermo-mechanical failure of semiconductor devices 402 (e.g., via testing elements 402a-b).

Control system 416 allows computing system 420 to control power supplies 410 and thermocouple controls 412. Control system 416 and event detector 414 are coupled to computing system 420 by interface 418. Computing system 420 may thus display current test status information as well as test success or failure modes of each of semiconductor devices 402.

Figure 5:
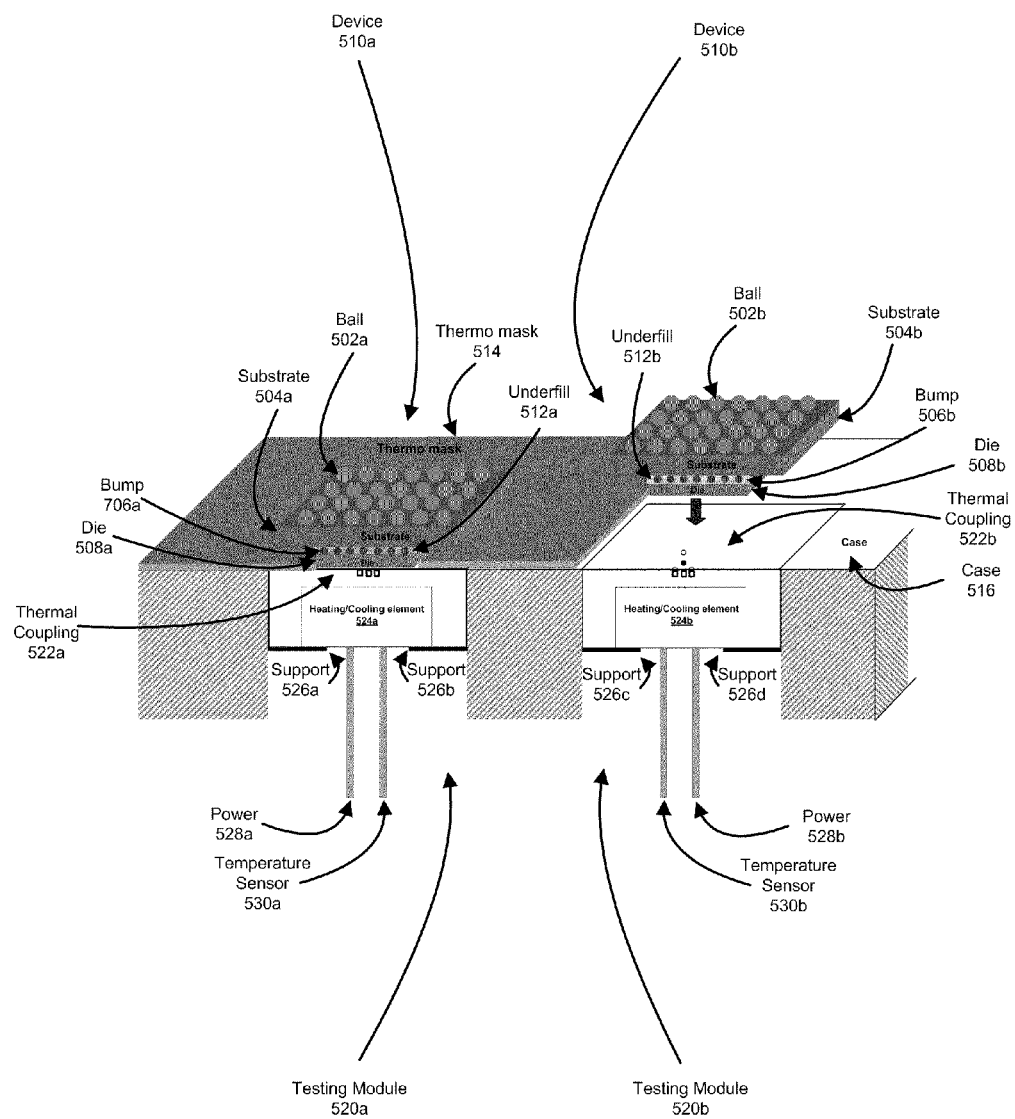
FIG. 5 shows a block diagram of an exemplary heating/cooling system and holder system configuration, in accordance with an embodiment of the present invention.

FIG. 5 shows a block diagram of an exemplary heating/cooling system and holder system, in accordance with an embodiment of the present invention. Exemplary heating/cooling system and holder system 500 includes case 516, thermo mask 514, supports 526a-d, and testing modules 520a-b. System 500 performs non-isothermal testing of devices 510a-b. In one embodiment, system 500 provides an inexpensive, fast, and universal non-isothermal temperature cycling test solution using external heating/cooling elements and a universal vacuum unit holding system. System 500 is operable to test semiconductor packages (e.g., packaged semiconductor devices), semiconductor packages mounted on a PCB, and test devices.

Testing modules 520a-b include heating and cooling elements 524a-b, thermal couplings 522a-b, connections for power 528a-b, and connections for temperature sensors 530a-b. In one embodiment, thermal couplings 522a-b make direct contact with devices 510a-b and allow conductive heating/cooling of a die or heat spreader coupled to a die which provides non-uniform temperature distribution across the test body (e.g., Si die, bump/underfill, substrate, and BGA ball). Heating/cooling elements 524a-b may include a peltier device which can increase/decrease the temperature of the dies 508a-b. Heating/cooling elements 524a-b may be a variety of devices including a resistance heater, fan, and liquid chiller. It is appreciated that a heater alone may not provide for a drop in temperature thereby limiting the temperature range and amount of thermo-mechanical stress that can be induced by temperature changes.

External heating and cooling of devices 510a-b is able to accelerate testing, which would not possible in an actual device system (e.g., computing environment) because thermal conductive heating/cooling elements 524a-b can provide a wide range of temperature profiles as well as fast ramp up and down rates (e.g., greater than in a computer system).

Testing modules 520a-b are able to individually and separately control (e.g., separately heat and cool) and monitor (e.g., via temperature sensors 530a-b and testing elements 402a-b) each of devices 510a-b which results in cost savings as individual devices (e.g., devices 510a-b) can be selectively replaced and rather than a whole test board (e.g., a PCB with multiple devices). Testing modules 520a-b further are able to heat up dies 508a-b which in turn heats subsequent portions of devices 510a-b in a manner similar to real computing environments. Testing modules 520a-b are operable to transfer thermal energy (e.g., heating and cooling), which transfers vertically through a Si die or heat spreader of devices 510a-b.

Testing modules 520a-b are further able to accelerate testing of real world conditions. For example, a real world test might turn a computer on/off 48 times a day for several months to mimic a computer being turned on/off 5 times a day for three to five years. In contrast, embodiments of the present invention provide the same results in several weeks by increasing the temperature delta. Referring to the previous example, when testing a computer system, the initial temperature may be 25° C. and in operation 100° C. which may be the limit as the computer would automatically turn off. The temperature cycling would thus be limited to a 75° C. delta. In contrast, heating/cooling elements 524a-b of the present invention allow cooling of the devices, for instance, bringing the devices down below room temperature and having a delta of 100° C. or larger. The larger delta (e.g., delta of 125° C.) provides for more accelerated testing.

In one embodiment, thermal couplings 522a-b are universal regarding the designs of devices 510a-b that can be thermally coupled to heating and cooling element 514 via use of a vacuum based holding system. For example, thermal couplings 522a-b eliminate the need for a dedicated socket, interposer, or clip to hold a testing package for good heat transfer. Thermal couplings 522a-b thus allow testing to be performed regardless of the die and package size. Thermal couplings 522a-b further maximize thermal contact while minimizing unwanted mechanical damage that would result from using a mechanical holder such as a clamp, clip, etc.

Devices 510a-b include balls 502a-b, substrates 504a-b, underfills 512a-b, bumps 506a-b, and dies 508a-b, respectively. As illustrated devices 510a-b may be tested in a flipped or upside down manner. Devices 510a-b may each have different material compositions (e.g., of bumps 506a-b and underfill 512a-b). Different materials may be chosen when new products are being developed, process technology changes (e.g., 90 nm, 65 nm, 40 nm), or standard change (e.g., Pb free solder, etc.). For example, a different underfill material may be need to use a lead free material or a material with more or less silver. Embodiments of the present invention allow comparison of different material performance and to determine which is better in terms of reliability. Embodiments of the present invention thus facilitate determination of the optimal material to ensure long product lifetime.

Figure 6A:
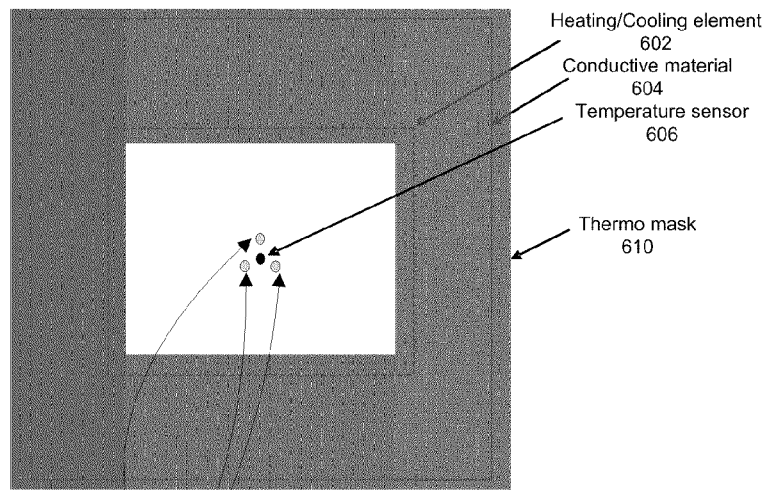
FIGS. 6A-B show block diagrams of an exemplary holder component, in accordance with an embodiment of the present invention.
Figure 6B:
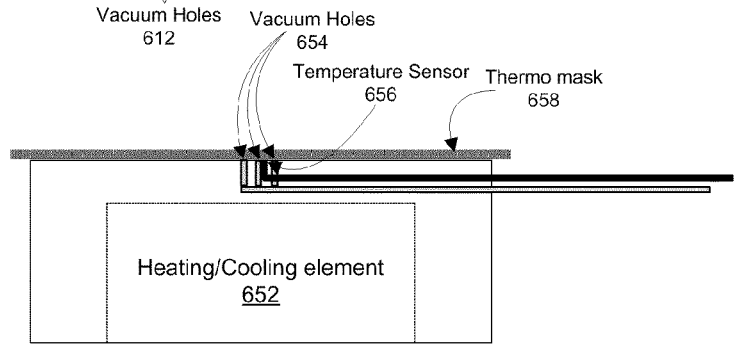

FIGS. 6A-B show block diagrams of an exemplary holding component, in accordance with an embodiment of the present invention. FIG. 6A shows a top view of an exemplary holding component 600, in accordance with an embodiment of the present invention. Exemplary holding component 600 includes conductive material 604, temperature sensor 606, thermo mask 610, and vacuum holes 612. Holding component 600 thermally couples heating/cooling element 602 to a semiconductor device.

Vacuum holes 612 allow negative pressure to be applied to a device thereby holding the test device down to heating/cooling element 602. Vacuum holes 612 hold a test device regardless of its size and provide almost seamless contact for effective heat transfer. It is appreciated that embodiments allow contact without need of any external mechanical attachment device (e.g., butterfly clamp, spring loaded clip, etc.). Further, it is appreciated that this non-mechanical vacuum method can minimize any mechanical damage during testing. As described herein, heating/cooling element 602 provides non-isothermal temperature cycling via conductive material 604 (e.g., Al, Cu, graphite, and stainless steel). The temperature cycling may be regulated via temperature sensor 606. Thermal mask 610 ensures a temperature gradient by blocking conventional heat flux from heating/cooling element 602 to the substrate of a device.

FIG. 6B shows a side view of an exemplary holding component, in accordance with an embodiment of the present invention. Exemplary holding component 650 includes heating/cooling element 652, vacuum holes 654, temperature sensor 656, and thermo mask 658 which function in substantially similar manners as described herein.

Figure 7:
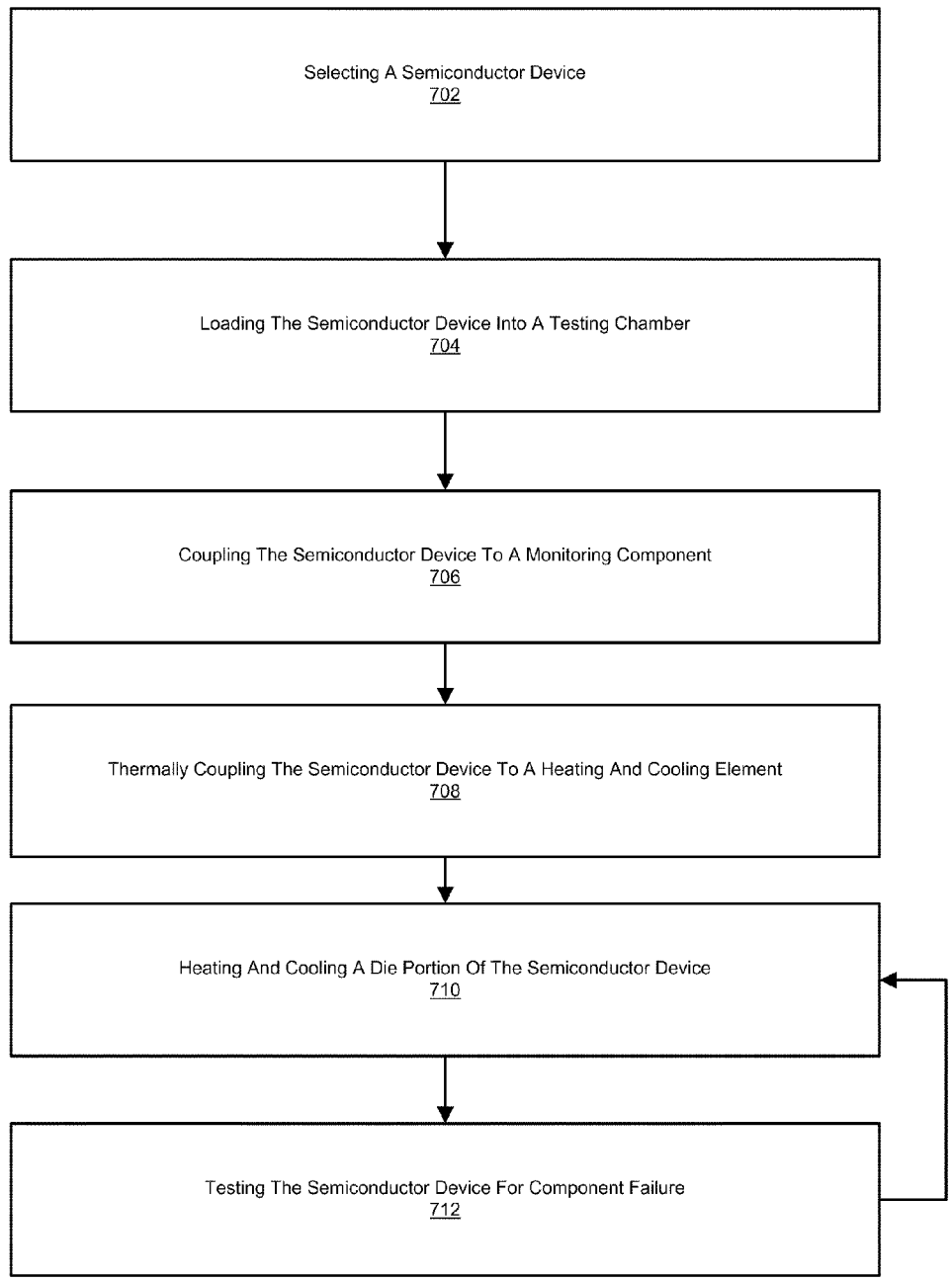
FIG. 7 shows a flowchart of an exemplary computer controlled process for testing packaged semiconductor devices, in accordance with an embodiment of the present invention.

With reference to FIG. 7, flowchart 700 illustrates an exemplary test process used by various embodiments of the present invention. Although specific function blocks ("blocks") are shown in flowchart 700, such steps are exemplary. That is, embodiments are well suited to performing various other blocks or variations of the blocks recited in flowchart 700. It is appreciated that the blocks in flowchart 700 may be performed in an order different than presented, and that not all of the blocks in flowchart 700 may be performed.

FIG. 7 shows a flowchart of an exemplary computer controlled process 700 for testing packaged semiconductor devices, in accordance with an embodiment of the present invention. Portions of process 700 may be carried out by a computer system (e.g., via computer system module 800) in conjunction with a testing system (e.g., system 320). It is appreciated that other portions of process 700 may be performed by technicians (e.g., testing technicians).

At block 702, a semiconductor device is selected based on a material composition of the semiconductor device for testing. As described herein, semiconductor devices may be manufactured with varying material compositions and tested to determine an optimal material composition.

At block 704, the semiconductor device is loaded into a testing chamber (e.g., via boards 404). In one embodiment, the airflow of the testing chamber is used to maintain an ambient temperature of the testing chamber (e.g., via fans).

At block 706, the semiconductor device is coupled to a monitoring component operable to test operations of the semiconductor device. As described herein, the monitoring component may be operable to measure a resistance of the semiconductor device to detect thermo-mechanical failure.

At block 708, the semiconductor device is thermally coupled to a heating and cooling element via a vacuum holding component. In one embodiment, the vacuum holding component comprises a conductive material. As described herein, the vacuum holding component may be operable to couple a plurality of different semiconductor die configurations and different semiconductor packages.

At block 710, a die portion of the semiconductor device is repeatedly heated and cooled with the heating and cooling element. As described herein, the heating and cooling may include non-isothermal temperature cycling.

At block 712, the semiconductor device is tested for component failure caused by thermo-mechanical stress induced by the non-isothermal temperature cycling. As described herein, the component failure may be determined based on a substantial increase in resistance. Blocks 710 and 710 may then be repeated.

Figure 8:
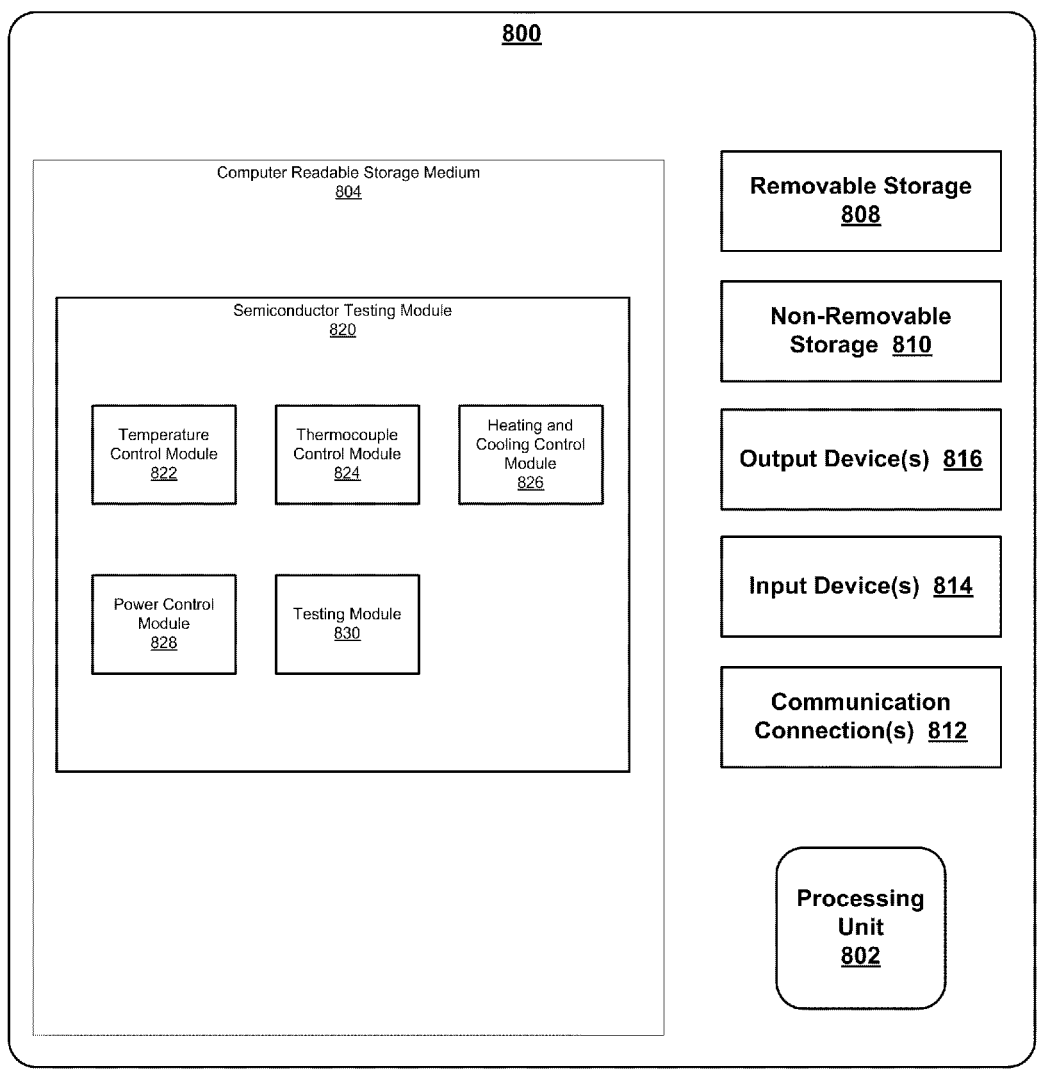
FIG. 8 shows an exemplary computer system, in accordance an embodiment of the present invention.

FIG. 8 shows a block diagram of an exemplary computer system module 800, in accordance with one embodiment of the present invention. With reference to FIG. 8, an exemplary system module for implementing embodiments includes a general purpose computing system environment, such as computing system environment 800. Computing system environment 800 may include, but is not limited to, servers (e.g., servers 106a-b), desktop computers, laptops, tablet PCs, mobile devices, and smartphones. In its most basic configuration, computing system environment 800 typically includes at least one processing unit 802 and computer readable storage medium 804. Depending on the exact configuration and type of computing system environment, computer readable storage medium 804 may be volatile (such as RAM), non-volatile (such as ROM, flash memory, etc.) or some combination of the two. Portions of computer readable storage medium 804 when executed facilitate semiconductor device testing (e.g., process 700).

Additionally, computing system environment 800 may also have additional features/functionality. For example, computing system environment 800 may also include additional storage (removable and/or non-removable) including, but not limited to, magnetic or optical disks or tape. Such additional storage is illustrated in FIG. 8 by removable storage 808 and non-removable storage 810. Computer storage media includes volatile and nonvolatile, removable and non-removable media implemented in any method or technology for storage of information such as computer readable instructions, data structures, program modules or other data. Computer readable medium 804, removable storage 808 and non-removable storage 810 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system environment 800. Any such computer storage media may be part of computing system environment 800.

Computing system environment 800 may also contain communications connection(s) 812 that allow it to communicate with other devices. Communications connection(s) 812 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Communications connection(s) 812 may allow computing system environment 800 to communicate over various networks types including, but not limited to, fiber channel, small computer system interface (SCSI), Bluetooth, Ethernet, Wi-fi, Infrared Data Association (IrDA), Local area networks (LAN), Wireless Local area networks (WLAN), wide area networks (WAN) such as the internet, serial, and universal serial bus (USB). It is appreciated the various network types that communication connection(s) 812 connect to may run a plurality of network protocols including, but not limited to, transmission control protocol (TCP), internet protocol (IP), real-time transport protocol (RTP), real-time transport control protocol (RTCP), file transfer protocol (FTP), and hypertext transfer protocol (HTTP).

Computing system environment 800 may also have input device(s) 814 such as a keyboard, mouse, pen, voice input device, touch input device, remote control, etc. Output device(s) 816 such as a display, speakers, etc. may also be included. All these devices are well known in the art and are not discussed at length.

In one embodiment, computer readable storage medium 804 includes semiconductor testing module 820 which includes temperature control module 822, thermocouple control module 824, heating cooling control module 826, power control module 828, and testing module 830. Temperature control module 822 receives temperature information from temperature sensors for each testing module (e.g., testing modules 820a-b) and coordinates with heating and cooling control module 826 to perform non-isothermal temperature cycling as described herein. Temperature control module 822 may further control the ambient temperature of the test chamber (e.g., via chamber condition controls 410a-b). Thermocouple control module 824 controls thermal coupling of devices to be tested (e.g., via thermal coupling elements 406a-b). Power control module 828 controls power to components of the test system (e.g., thermal coupling elements 406a-b, heating and cooling elements 408a-b, and testing elements 402a-b). Testing module 830 facilitates testing of devices (e.g., testing resistance for thermo-mechanical failure).

Embodiments of the present invention thus provide for non-isothermal temperature cycling testing reflective of real world usage conditions. This allows individually controlled testing of various semiconductor device material compositions under real world usage conditions. Embodiments of the present invention further provide a universal thermal coupling mechanism allowing different semiconductor designs and packages to be tested without need for specialized hardware. Thus, economical testing solutions both in terms of time and cost are provided.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of testing a semiconductor device comprising:
   loading said semiconductor device into a testing chamber, said semiconductor device comprising a die and a substrate;
   positioning said die proximate to a heating and cooling element via a vacuum holding component;
   locally heating and cooling said die with said heating and cooling element through non-isothermal temperature cycling, wherein said non-isothermal temperature cycling comprises a number of heating-cooling cycles; and
   testing said semiconductor device for component failure caused by thermo-mechanical stress induced by said non-isothermal temperature cycling.

2. The method as described in claim 1 wherein said semiconductor device is selected for testing based on having a material composition to be tested for thermo-mechanical stress.

3. The method as described in claim 1 further comprises:
   coupling said semiconductor device to a monitoring component operable to test operations of said semiconductor device.

4. The method as described in claim 3 further comprising inhibiting heat transfer between said heating and cooling element to said substrate by using a thermal mask.

5. The method as described in claim 1 further comprising maintaining an ambient temperature of said testing chamber using an airflow into said testing chamber.

6. The method as described in claim 1 wherein said vacuum holding component comprises a conductive material.

7. The method as described in claim 1 wherein said vacuum holding component is operable to couple a plurality of different semiconductor die configurations.

8. The method as described in claim 1 wherein said vacuum holding component is operable to couple a plurality of different semiconductor package configurations.

9. A testing system comprising:
   a heating and cooling assembly configured to locally heat and cool a die component of a semiconductor device through non-isothermal temperature cycling, said non-isothermal temperature cycling comprising a number of heating and cooling cycles;
   a vacuum holding assembly configured to position said die component proximate to said heating and cooling assembly; and
   a testing assembly configured to test said semiconductor devices for failure caused by thermo-mechanical stress induced by said non-isothermal temperature cycling.

10. The system of claim 9 further comprising a testing chamber configured to contain said semiconductor device, wherein said testing chamber is maintained at an approximately room temperature during said non-isothermal temperature cycling.

11. The system of claim 9, wherein said vacuum holding assembly comprises a vacuum plate.

12. The system of claim 9 further comprising a heat mask surrounding said die and configured to inhibit heat transfer between said heating and cooling assembly and a substrate of said semiconductor device, said substrate coupled to said die component.

13. The system of claim 9 wherein said heating and cooling assembly is configured to control thermal energy transferred to said semiconductor device.

14. The system of claim 9 wherein said vacuum holding assembly is configured to couple to a plurality of different semiconductor package configurations.

15. The system of claim 9 wherein said heating and cooling assembly comprises a peltier.

16. The system of claim 11 wherein—said vacuum plate comprising a conductive material and configured to: support said semiconductor device through direct contact with said die component; and facilitate heat transfer between said heating and cooling assembly and said die component.

17. A system for testing a plurality of semiconductor devices comprising:
   a plurality of heating and cooling elements configured to repeatedly heat and cool said plurality of semiconductor devices through non-isothermal temperature cycling, wherein each semiconductor device comprises a die portion and a substrate, wherein each of said plurality of heating and cooling elements is operable to locally heat and cool die portion of a respective semiconductor devices, and wherein said non-isothermal temperature cycling comprises a number of heating and cooling cycles;
   a plurality of vacuum holding elements operable to: position die portions of said plurality of semiconductor devices proximate to corresponding heating and cooling elements; and thermally couple said die portions to said corresponding heating and cooling elements; and
   a plurality of testing elements operable to test said plurality of semiconductor devices for component failure caused by thermo-mechanical stress induced by said non-isothermal temperature cycling.

18. The system of claim 17 wherein said plurality of testing elements are operable to monitor resistance of said plurality of semiconductor devices in real time.

19. The system of claim 17 wherein said plurality of heating and cooling elements comprise a plurality of peltiers and heaters.

20. The system of claim 17 wherein each of said plurality of testing elements is operable to detect failure in solder bumps between a die portion and a substrate of a semiconductor device.

21. The system of claim 17 wherein said plurality of heating and cooling elements are operable to heat and cool said plurality of semiconductor devices via a respective heat spreader coupled to the respective die portion of each of said plurality of semiconductor devices.

* * * * *